(12) United States Patent
Kim et al.

(10) Patent No.: US 7,675,059 B2
(45) Date of Patent: Mar. 9, 2010

(54) COPOLYMER, ORGANIC INSULATING LAYER COMPOSITION, AND ORGANIC INSULATING LAYER AND ORGANIC THIN FILM TRANSISTOR MANUFACTURED USING THE SAME

(75) Inventors: Joo Young Kim, Suwon-si (KR); Eun Kyung Lee, Seoul (KR); Sang Yoon Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 301 days.

(21) Appl. No.: 11/976,127

(22) Filed: Oct. 22, 2007

(65) Prior Publication Data

US 2008/0197345 A1   Aug. 21, 2008

(30) Foreign Application Priority Data

Feb. 16, 2007   (KR) .................. 10-2007-0016517

(51) Int. Cl.
*H01L 35/24* (2006.01)
*H01L 51/00* (2006.01)

(52) U.S. Cl. .......... 257/40; 257/E39.007; 257/E51.018; 257/E51.022; 438/82; 438/99

(58) Field of Classification Search .................. 257/40, 257/E39.007, E51.018, E51.022; 438/82, 438/99, 623, 725
See application file for complete search history.

(56) References Cited

U.S. PATENT DOCUMENTS 5,981,970 A   11/1999  Dimitrakopoulos et al.

7,166,859 B2 *   1/2007  Hirose et al. .................. 257/40

FOREIGN PATENT DOCUMENTS

EP   1494298   1/2005
EP   1679754   7/2006

OTHER PUBLICATIONS

European Search Report dated Apr. 3, 2008, in corresponding European Patent Application No. 08150107.4.

* cited by examiner

*Primary Examiner*—Leonardo Andujar
*Assistant Examiner*—Monica D Harrison
(74) *Attorney, Agent, or Firm*—Harness, Dickey & Pierce, P.L.C.

(57) ABSTRACT

Disclosed herein is a copolymer, which may include side chains which may decrease the surface energy of an insulating layer, thereby improving the alignment of a semiconductor material, and side chains including photoreactive functional groups having an increased degree of cross-linking, thereby improving the characteristics of an organic thin film transistor manufactured using the same, an organic insulating layer composition including the copolymer, an organic insulating layer, an organic thin film transistor, an electronic device including the same and methods of fabricating the same. According to the copolymer of example embodiments, the surface energy of an insulating layer may be decreased, so that the alignment of a semiconductor material may be improved, thereby improving the threshold voltage and charge mobility and decreasing the generation of hysteresis at the time of driving the transistor.

28 Claims, 2 Drawing Sheets

COPOLYMER, ORGANIC INSULATING LAYER COMPOSITION, AND ORGANIC INSULATING LAYER AND ORGANIC THIN FILM TRANSISTOR MANUFACTURED USING THE SAME

PRIORITY STATEMENT

This application claims priority under U.S.C. § 119 to Korean Patent Application No. 10-2007-0016517, filed on Feb. 16, 2007, in the Korean Intellectual Property Office (KIPO), the entire contents of which are incorporated herein by reference.

BACKGROUND

1. Field

Example embodiments relate to a copolymer, an organic insulating layer composition, an organic insulating layer and an organic thin film transistor manufactured using the same. Other example embodiments relate to a copolymer, which includes side chains which may decrease the surface energy of an insulating layer, thereby improving the alignment of a semiconductor material, and side chains including photoreactive functional groups having an increased degree of cross-linking, thereby improving the characteristics of an organic thin film transistor manufactured using the same, an organic insulating layer composition including the same, and an organic insulating layer and an organic thin film transistor manufactured using the same.

2. Description of the Related Art

An Organic Thin Film Transistor (OTFT) may be used as a switching device for controlling the operation of each pixel of a device for driving each pixel in a flat-panel display, e.g., a liquid crystal display (LCD) and/or an electroluminescent display (ELD). The organic thin film transistor may be used for a smart card and/or a plastic chip for an inventory tag.

This organic thin film transistor may include a semiconductor layer having a source region and a drain region doped with an increased concentration of impurities and a channel region formed therebetween. Further, the organic thin film transistor may be configured to include a gate electrode which is insulated from the semiconductor layer and located in a region corresponding to the channel region, and a source electrode and drain electrode, which are respectively in contact with the source region and the drain region.

In initial research into an organic thin film transistor (OTFT), conventional silicon-based inorganic insulator materials, e.g., SiOx and/or SiNx, were used as insulating layers. However, as larger sized, inexpensive and flexible displays have been required, there is more demand for organic insulator materials, rather than inorganic insulator materials. Commonly usable polymer materials, e.g., polyvinylalcohol, polyvinylphenol and/or polymethylmethacrylate, have been used as a gate insulating layer of an organic thin film transistor. These polymer materials may be formed into an insulating layer through a relatively low-cost processes, e.g., spin coating, but there may be difficulty in effectively controlling the interaction between the polymer materials and organic semiconductor molecules to thus improve the performance thereof.

For example, the related art discloses an organic thin film transistor in which the driving voltage and threshold voltage thereof are decreased using a high dielectric constant insulating layer. A gate insulating layer may be formed using inorganic metal oxides, e.g., $Ba_xSr_{1-x}TiO_3$ (BST; Barium Strontium Titanate), $Ta_2O_5$, $Y_2O_3$ and/or $TiO_2$, or ferroelectric insulating materials, e.g., $PbZr_xTi_{1-x}O_3$(PZT), $Bi_4Ti_3O_{12}$, $BaMgF_4$, $SrBi_2(Ta_{1-x}Nb_x)_2O_9$, $Ba(Zr_{1-x}Ti_x)O_3$ (BZT), $BaTiO_3$, $SrTiO_3$ and/or $Bi_4Ti_3O_{12}$, through a chemical vapor deposition, physical vapor deposition, sputtering and/or sol-gel coating method. According to the related art, driving voltage may be decreased, but charge mobility may not be as high as before, and most manufacturing processes may be performed at an increased temperature of about 200° C.~about 400° C., so that plastic substrates, for flexible displays, may not be used. General wet processes, e.g., a simple coating or printing, may be difficult to use at the time of manufacturing devices.

In an organic thin film transistor, because the surface characteristics of an insulating layer have an influence on the improvement of the performance of an organic thin film transistor, various research on a gate insulating layer, which may increase the degree of charge transport on the surface between a gate insulating layer and an organic semiconductor layer and may be formed through a simpler process, is being conducted. As the surface energy of an insulating layer is lowered, for example, the insulating layer may exhibit relatively strong hydrophobicity, and the alignment of a semiconductor material in an organic semiconductor layer may be improved, thereby realizing improved transistor performance. Accordingly, attempts have been made to improve the degree of charge transport by surface-treating an insulating layer. However, in these attempts, because additional surface-treatment must be performed, overall processibility may decrease, and costs may increase.

The organic thin film transistor, manufactured using an organic insulator, may cause hysteresis at the time of driving the organic thin film transistor because charges may be trapped and accumulated between a semiconductor and an insulator, or the organic insulator may absorb moisture due to water in the air. Due to such hysteresis, occurring at the time of driving the organic thin film transistor, use of the organic thin film transistor for actual displays and logic devices may be difficult, even if desired electrical characteristics are exhibited.

SUMMARY

Accordingly, example embodiments have been made keeping in mind the above problems occurring in the related art, and example embodiments provide a copolymer, which may impart strong hydrophobicity to an insulating layer even if the insulating layer is not additionally surface-treated at the time of forming the copolymer into the insulating layer, and which may decrease hysteresis at the time of driving an organic thin film transistor, manufactured using the copolymer, by increasing degree of photocrosslinking. The insulating layer including the copolymer of example embodiments may minimize or reduce the absorption of moisture by the insulating layer, and charges may not be easily trapped while passing through a channel layer of a semiconductor, or such trapped charges may rapidly escape therefrom.

Example embodiments provide an organic insulating layer having relatively low surface energy, manufactured using the copolymer, and an organic thin film transistor having improved charge mobility, including the organic insulation layer.

Example embodiments provide a copolymer including a repeat unit (A) and a repeat unit (B), represented by the following formula (1):

(A)

(B)

wherein,

R is a substituted or unsubstituted alky group of about 1 to about 12 carbon atoms, and the substituted alkyl group may include F or Cl, R' is represented by the following formula (2), the sum of m and n is about 1, m is a real number from about 0.1 to about 0.9, and n is a real number from about 0.1 to about 0.9, the sum of x and y is about 1, x is a real number from about 0.1 to about 0.9, and y is a real number from about 0.1 to about 0.9, and a and b are the amounts (mol %) of repeat units (A) and (B) in the copolymer, respectively, a is about 10 mol % to about 90 mol %, and b is about 90 mol % to about 10 mol %.

Formula (2)

wherein, $R_1$ is one or more selected from the group consisting of functional groups represented by the following formula (3),

$R_2$ is one or more photoreactive functional groups selected from the group consisting of the following formula (4), and k is an integer from about 0 to about 3.

In the case where $R_1$ is plural in number, each $R_1$ may be the same, or the $R_1$s may be different from each other.

Formula (3)

wherein m is an integer from about 1 to about 12.

Example embodiments provide an organic insulating layer composition including the copolymer of example embodiments. Example embodiments provide an organic thin film transistor including a substrate, a gate electrode, a gate insulating layer, an organic semiconductor layer, a source electrode, and a drain electrode, wherein the gate insulating layer includes the copolymer of example embodiments.

BRIEF DESCRIPTION OF THE DRAWINGS

Example embodiments will be more clearly understood from the following detailed description taken in conjunction with the accompanying drawings. FIGS. 1-4 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Hereinafter, example embodiments in detail with reference to the attached drawings. Reference now should be made to the drawings, in which the same reference numerals are used throughout the different drawings to designate the same or similar components. In the drawings, the thicknesses and widths of layers are exaggerated for clarity. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A copolymer, according to example embodiments, may include side chains, which may decrease the surface energy of an insulating layer, thereby improving the alignment of a semiconductor material in an organic semiconductor layer, and side chains including photoreactive functional groups may have a an increased degree of cross-linking.

The copolymer, according to example embodiments, may include two kinds of repeat units having two functions, for example, a repeat unit (A) for imparting hydrophobicity and a repeat unit (B) for imparting photocrosslinking characteristics, and may selectively include a repeat unit (C). The repeat units may be the same as or different from each other.

The copolymer, according to example embodiments, may include a repeat unit (A) and a repeat unit (B), represented by the following formula (1):

Formula (1)

wherein,

R is a substituted or unsubstituted alky group of about 1 to about 12 carbon atoms, and the substituted alkyl group may include F or Cl, R' is represented by the following formula (2), the sum of m and n is about 1, m is a real number from about 0.1 to about 0.9, and n is a real number from about 0.1 to about 0.9, the sum of x and y is about 1, x is a real number from about 0.1 to about 0.9, and y is a real number from about 0.1 to about 0.9, and a and b are the amounts (mol %) of repeat units (A) and (B) in the copolymer, respectively, a is about 10 mol % to about 90 mol %, and b is about 90 mol % to about 10 mol %.

Formula (2)

wherein, $R_1$ is one or more selected from the group consisting of functional groups represented by the following formula (3), $R_2$ is one or more photoreactive functional groups selected from the group consisting of the following formula (4), and k is an integer from about 0 to about 3.

In the case where $R_1$ is plural in number, each $R_1$ may be the same, or the $R_1$s may be different from each other.

Formula (3)

wherein m is an integer from about 1 to about 12.

Formula (4)

The state and effect of an insulation layer may appear improved within the limited ranges of m, n, x, y, i and j in the above formula (1). Although an insulating layer may also be formed beyond the limited range, the state of a thin film may be undesirable, thereby causing the deterioration of characteristics of an insulating layer.

The surface energy of an insulating layer may be indirectly measured by measuring the contact angle of water. In conventional insulating layers, generally, the contact angle of water may be about 60°. In contrast, the contact angle for an organic insulating layer formed using a copolymer of example embodiments may be about 85° ~about 95°. Accordingly, in the case of forming an insulating layer using a copolymer of example embodiments, even if additional surface-treatment is not performed, the surface energy of the insulating layer may be relatively low, for example, the insulating layer may exhibit relatively strong hydrophobicity, thereby improving the performance of an organic thin film transistor using a polymer semiconductor.

The copolymer, according to example embodiments, may further include a repeat unit (C), represented by the following formula (5), such that the amount of the repeat unit (C) may be about 0 mol % ~about 20 mol %, based on the sum of the amount of the repeat unit (A) and the repeat unit (B).

Formula (5)

(C)

wherein, the sum of I and j is about 1, i is a real number from about 0.1 to about 0.9, and j is a real number from about 0.1 to about 0.9, and c is determined depending on the amount of the repeat unit (C).

In the copolymer represented by the above Formula (1), the repeat unit (A) may be represented by the following formula (6) or (7), but may not be limited thereto.

Formula (6)

Formula (7)

Formula (9)

In the copolymer represented by the above Formula (1), the repeat unit (B) may be represented by the following formula (8) or (9), but may not be limited thereto.

Formula (8)

According to example embodiments, an organic insulating layer, formed using the copolymer, may exhibit relatively strong hydrophobicity, thereby increasing the alignment of a semiconductor material. Accordingly, an organic thin film transistor including this organic insulating layer as a gate insulating layer may have increased charge mobility and an increased current on/off ratio, thereby realizing improved characteristics. Further, because the copolymer according to example embodiments may include a repeat unit having a photoreactive functional group, when it is part of an organic insulating layer in an organic thin film transistor, the generation of hysteresis due to the trapping of charges on the surface between a gate insulating layer and an organic semiconductor layer in the organic thin film transistor and a temporary polarizing phenomenon of an insulating material may be suppressed, thereby realizing uniform characteristics without hysteresis. The copolymer, according to example embodiments, may have an average molecular weight of about 3000~about 200,000.

The copolymer, according to example embodiments, may be prepared by copolymerizing a monomer constituting a repeat unit (A), a monomer constituting a repeat unit (A), which may be represented by the above formula (1), and a monomer selectively constituting a repeat unit (C) in the amounts defined above.

Example embodiments provide an organic insulating layer composition including a copolymer including a repeat unit (A) and a repeat unit (B), represented by the following formula (1):

Formula (1)

(A)

(B)

wherein,
R is a substituted or unsubstituted alky group of about 1 to about 12 carbon atoms, and the substituted alkyl group may include F or Cl,
R' is represented by the following formula (2),
the sum of m and n is about 1, m is a real number from about 0.1 to about 0.9, and n is a real number from about 0.1 to about 0.9,
the sum of x and y is about 1, x is a real number from about 0.1 to about 0.9, and y is a real number from about 0.1 to about 0.9, and
a and b are the amounts (mol %) of repeat units (A) and (B), respectively, a is about 10 mol % to about 90 mol %, and b is about 90 mol % to about 10 mol %.

Formula (2)

wherein,
$R_1$ is one or more selected from the group consisting of functional groups represented by the following formula (3),
$R_2$ is one or more photoreactive functional groups selected from the group consisting of the following formula (4), and
k is an integer from about 0 to about 3.

In the case where $R_1$ is plural in number, each $R_1$ may be the same, or the $R_1$s may be different from each other.

Formula (3)

wherein m is an integer from about 1 to about 12.

Formula (4)

The copolymer may further include a repeat unit (C), represented by the following formula (5), such that the amount of the repeat unit (C) may be about 0 mol % ~about 20 mol %, based on the sum of the amount of the repeat unit (A) and the repeat unit (B).

Formula (5)

(C)

wherein,
the sum of I and j is about 1, i is a real number from about 0.1 to about 0.9, and j is a real number from about 0.1 to about 0.9.

In the copolymer represented by the above Formula (1), the repeat unit (A) may be represented by the following formula (6) or (7), but may not be limited thereto.

Formula (6)

Formula (7)

Formula (9)

In the copolymer represented by the above Formula (1), the repeat unit (B) may be represented by the following formula (8) or (9), but may not be limited thereto.

Formula (8)

When forming an organic insulating layer for an organic thin film transistor using the organic insulating layer composition of example embodiments, the organic insulating layer composition may be mixed with a cross-linking agent in order to improve the degree of cross-linking. The cross-linking agent, which may be used in example embodiments, may include one or more selected from the group consisting of dipentaerythritol pentaacrylate, dipentaerythritol hexaacrylate, polyethyleneglycol diacrylate, and polyethyleneglycol dimethacrylate, but may not be limited thereto. This cross-linking agent may be used in an amount of about 10 wt % ~about 40 wt % relative to the total amount of the composition.

The solvent, which may be used in the organic insulating layer composition of example embodiments, may include an aliphatic hydrocarbon solvent, e.g., hexane, an aromatic hydrocarbon solvent, e.g., anisol, mesitylene and/or xylene, a ketone-based solvent, e.g., methyl isobutyl ketone, 1-methyl-2-pyrrolidinone and/or acetone, an ether-based solvent, e.g., cyclohexanone, tetrahydrofuran and/or isopropyl ether, an acetate-based solvent, e.g., ethyl acetate, butyl acetate and/or propylene glycol methyl ether acetate, an alcohol-based solvent, e.g., isopropyl alcohol and/or butyl alcohol, an amide-based solvent, e.g., dimethylacetamide and/or dimethylformamide, a silicon-based solvent, and a mixture thereof.

For example, the organic insulating layer composition may include about 5 wt % ~about 15 wt % of a copolymer, about 10 wt % ~about 40 wt % of a cross-linking agent, based on the copolymer, and a residual solvent.

Example embodiments provide an organic insulating layer formed by applying the organic insulating layer composition on a substrate and then curing the organic insulating layer composition. This organic insulating layer may be formed using any conventional wet coating method. For example, a spin coating method, a dip coating method, a roll coating method, a screen coating method, a spray coating method, a spin casting method, a flow coating method, a screen printing method, an ink-jet method and/or a drop casting method may be used as a method of forming the organic insulating layer, for example, a spin coating method. Where the spin coating method is used, spin speed may be within the range of about 400 rpm ~about 4000 rpm.

The curing step for forming the organic insulating layer may be performed by heating a substrate to a temperature of about 70° C. ~about 200° C. for about 30 minutes ~about 2 hours. However, the curing conditions may be different depending on the kind of copolymer and/or the composition of the organic insulating layer.

The organic insulating layer may have improved insulation characteristics, and an organic thin film transistor manufactured using the same may have increased charge mobility, decreased driving voltage and threshold voltage, and improved current on/off ratio (Ion/Ioff). For example, the preparation of the organic insulating layer may be performed by a general wet method, e.g., a printing method and/or a spin coating method, but even so, the performance thereof may be equal to a silicon-based inorganic insulating layer, which may only be formed through a cumbersome process, e.g., chemical vapor deposition.

The organic insulating layer may be effectively used for manufacturing various electronic devices, e.g., a liquid crystal display (LCD), a photovoltaic device, an organic light emitting diode (OLED), a sensor, memory and/or an integrated circuit, by improving the unit characteristics of an organic thin film transistor. The organic insulating layer may be applied to the electronic devices through a conventional process commonly known in the art.

Further, example embodiments provide an organic thin film transistor including the organic insulating layer as a gate insulating layer. For example, the organic thin film transistor according to example embodiments may include a substrate, a gate electrode, a gate insulation layer, an organic semiconductor layer, a drain electrode and a source electrode. The gate insulating layer may be formed using the copolymer of example embodiments.

Figure 1:
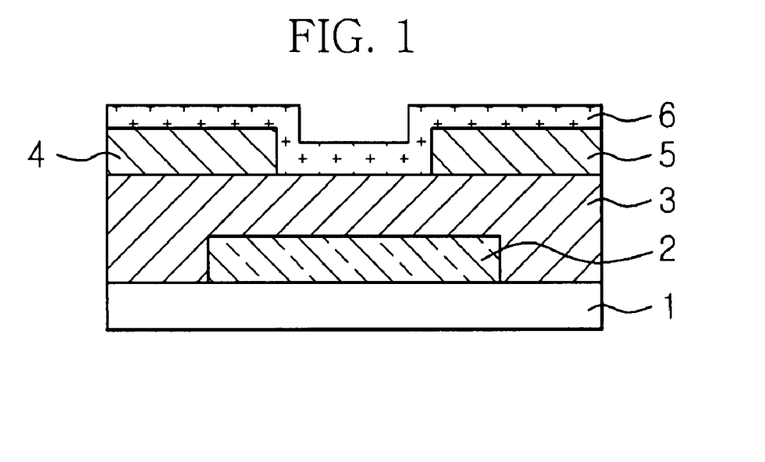
FIG. 1 is a schematic sectional view illustrating an organic thin film transistor having a bottom contact structure according to example embodiments.
Figure 2:
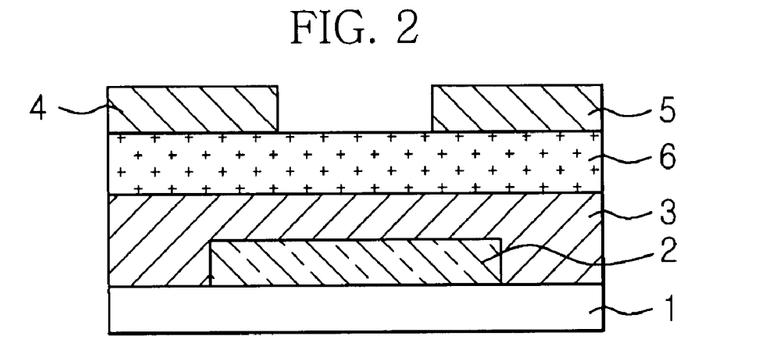
FIG. 2 is a schematic sectional view illustrating an organic thin film transistor having a top contact structure according to example embodiments.
Figure 3:
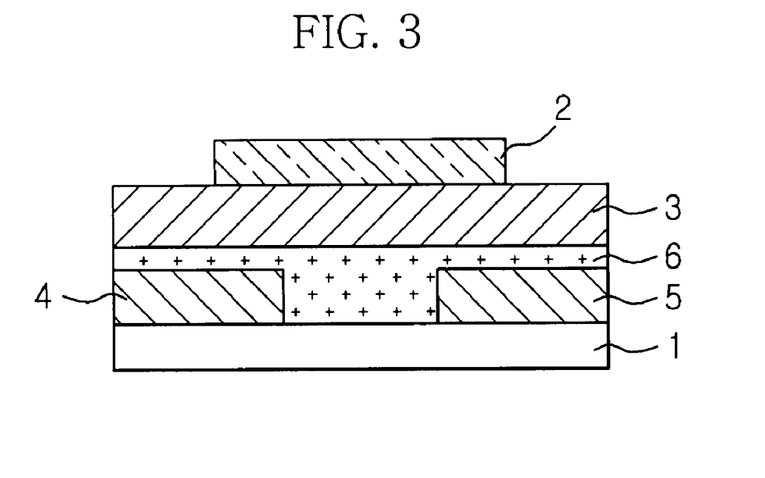
FIG. 3 is a schematic sectional view illustrating an organic thin film transistor having a top gate structure according to example embodiments.

The organic thin film transistor of example embodiments may have a top contact structure, a bottom contact structure, or a top gate structure, without particular limitation. FIGS. 1 and 2 schematically show structures of the organic thin film transistor, which may be manufactured using the copolymer of example embodiments. FIG. 1 is a schematic sectional view showing an organic thin film transistor having a bottom contact structure, FIG. 2 is a schematic sectional view showing an organic thin film transistor having a top contact structure and FIG. 3 is a schematic sectional view showing an organic thin film transistor having a top gate structure.

For example, the organic thin film transistor of example embodiments, as shown in FIG. 1, may have a structure in which a gate electrode 2, a gate insulating layer 3, a source electrode 4 and a drain electrode 5, which are placed on the same layer, and an organic semiconductor layer 6 may be sequentially layered on a substrate 1, or as shown in FIG. 2, may have a structure in which a gate electrode 2, a gate insulating layer 3, an organic semiconductor layer 6, and a source electrode 4 and a drain electrode 5, which are placed on the same layer, may be sequentially layered on a substrate 1. Also, as shown in FIG. 3, the OTFT of example embodiments may have a structure in which a source electrode 4 and a drain electrode 5, which are placed on the same layer, an organic semiconductor layer 6, a gate insulating layer 3, and a gate electrode 2 may be sequentially layered on a substrate 1.

In the organic thin film transistor of example embodiments, a glass substrate, a silicon wafer substrate, a polyethyleneterephthalate (PET) substrate, a polycarbonate (PC) substrate, a polyethersulfone (PES) substrate and/or a polyethylene naphthalate (PEN) substrate may be used as the substrate 1.

Commonly used organic semiconductor materials may be used as the organic semiconductor layer 6. Specifically, the organic semiconductor material may include pentacene, copper phthalocyanine, polythiophene, polyaniline, polyacetylene, polypyrrole, polyphenylene vinylene, and derivatives thereof, but may not be limited thereto.

As the material for a gate electrode 2, a source electrode 4 and a drain electrode 5 of the organic thin film transistor according to example embodiments, commonly used metals or conductive polymers may be used. For example, the material may include doped silicon (Si) or gold (Au), silver (Ag), aluminum (Al), copper (Cu), nickel (Ni), chromium (Cr), molybdenum (Mo), tungsten (W) and/or indium tin oxides (ITO), but may not be limited thereto. The substrate 1 may be cleaned, and thus impurities may be removed therefrom, and then the metals may be deposited and patterned on the cleaned substrate 1 through a conventional process, e.g., chemical vapor deposition, plasma chemical vapor deposition and/or sputtering, thereby forming the electrodes.

Example embodiments provide an electronic device including the organic thin film transistor of example embodiments. The organic thin film transistor of example embodiments may overcome the inconvenience in the required process of performing additional surface treatment on an insulating layer, and thus may simplify the process, and may have greatly improved characteristics, e.g., threshold voltage and/or charge mobility. Accordingly, the manufacture of various electronic devices, e.g., a liquid crystal display (LCD), a photovoltaic device, an organic light emitting diode (OLED), a sensor, memory and/or an integrated circuit, may be useful.

Hereinafter, example embodiments will be described in detail with reference to Examples. Here, these Examples are set forth to illustrate example embodiments, but should not to be construed as the limit of example embodiments.

PREPARATION EXAMPLE 1

Coumarin-oxyhexylbenzoic acid (BHC-coumarin) was synthesized through the following process.

About 50 g of 7-hydroxycoumarin (about 0.308 mol, about 1.0 eq) was put into about 1 l of acetone, and then about 85.13 g (about 0.616 mol, about 2 eq) potassium carbonate and about 150.3 g (about 0.616 mol, about 2 eq) 1,6-dibromohexane were added thereto and refluxed for about 24 hours to form a reaction solution. Subsequently, the reaction solution was filtered, and thus a solvent was removed therefrom, and then ether and water were added thereto, thus the mixture was extracted with ether to obtain a compound. The obtained compound was recrystallized using hexane to obtained a desired compound 1_(about 64.89 g, yield about 65%).

The obtained compound 1 about 48.78 g (about 0.15 mol, about 1 eq) was put into about 750 ml of acetone, and then about 62 g (about 0.75 mol, about 3 eq) potassium carbonate and about 24.93 g (about 0.15 mol, about 1 eq) ethyl-4-hydroxybenzoate were added thereto, and refluxed for about 24 hours to form a reaction solution. Subsequently, the reaction solution was filtered and then washed with chloroform, and then a solvent was removed therefrom to obtain a compound. The obtained compound was recrystallized using ethanol to obtain a compound 2 (about 53.74 g, yield about 87.3%).

The obtained compound 2 about 53.74 g was put into about 600 ml of ethanol, and about 600 ml of an about 1 M NaOH solution was added thereto, and the mixture was then stirred for about 48 hours. Subsequently, the compound was acidified using an about 10% HCl solution, and then filtered to obtain a compound. The obtained compound was recrystallized using ethanol to obtain a desired coumarin-oxyhexylbenzoic acid (compound 3) (about 40 g, yield about 80%).

Under a nitrogen atmosphere, about 5 g (about 13.075 mmol, about 1 eq) coumarin-oxyhexylbenzoic acid (compound 3) was put into about 100 ml of methylene chloride, and about 1.71 g of thionylchloride (about 14.383 mmol, about 1.1 eq) was added thereto, and the mixture was then stirred at about 35° C. for about 5 hours to form a reaction solution. Subsequently, a solvent was removed from the reaction solution, and then the residual was recrystallized using ethylacetate/hexane to obtain coumarin-oxyhexylbenzoyl chloride (compound 4).

Under a nitrogen atmosphere, a polyhydroxymaleimide-polyhydroxystyrene polymer (compound 5) about 1.733 g (about 5.60 mmol, about 0.35 eq) was dissolved in about 20 ml of N-methylpyrrolidone, and was then cooled to about 0° C. About 2.04 g of triethylamine (about 20.16 mmol, about 2.5 eq) was added thereto, and the mixture was then stirred for about 1 hour. The coumarin-oxyhexylbenzoyl chloride (compound 4), synthesized above, and about 0.656 g of octanoyl chloride (about 4.03 mmol, about 0.3 eq) were added thereto at about 0° C., were heated to about room temperature, and were then stirred for a day to form a reaction solution. The reaction solution was put into methanol and water to form a solid, the solid was filtered, and then the isolated solid was extracted with methanol, thereby preparing a white solid copolymer 6 (about 5.3 g, yield 96%).

PREPARATION EXAMPLE 2

Under a nitrogen atmosphere, about 1.733 g of polyhydroxymaleimide-polyhydroxystyrene polymer (compound 5) (about 5.60 mmol, about 0.35 eq) was dissolved in about 20 ml of N-methylpyrrolidone, and was then cooled to about 0° C. About 2.04 g of triethylamine (about 20.16 mmol, about 2.5 eq) was added thereto, and then the mixture was stirred for about 1 hour. The coumarin-oxyhexylbenzoyl chloride (compound 4) synthesized above, and about 5.034 g of perfluorooctanoyl chloride (about 11.64 mmol, about 1.0 eq) were added thereto at about 0° C., heated to about room temperature, and then stirred for about one day to form a reaction solution. The reaction solution was put into methanol and water to form a solid, the solid was filtered, and then the isolated solid was extracted with methanol, thereby preparing a white solid copolymer 7 (about 5.3 g, yield 88%).

EXAMPLE 1

Manufacturing of Organic Thin Film Transistor

An organic thin film transistor device, as shown in FIG. 1, was manufactured using the copolymer obtained in Preparation Examples 1 and 2 as an insulator of an organic thin film transistor.

A gate electrode having a thickness of about 2000Å was formed on a cleaned glass substrate using aluminum (Al) through a vacuum deposition method. The substrate, on which the aluminum gate electrode was formed, was washed with acetone and isopropyl alcohol for about 10 minutes each to prepare the substrate.

The copolymer obtained in Preparation Examples 1 and 2 was dissolved in a cyclohexanone solution such that the concentration thereof was about 5 wt %, and was filtered using a syringe filter having a diameter of about 0.2 μm to provide an insulator solution. The insulator solution was applied on the gate electrode and substrate using a spin coating method at a spin speed of about 1000 rpm for about 50 seconds, and was then dried in a hot plate at about 70° C. for about 2 minutes. The insulator was photocrosslinked through ultraviolet irradiation in a high-pressure mercury lamp having a power of about 200 W, which may provide a wavelength band of about 250 nm ~about 400 nm, for about 1 minute, and was then cured in a hot plate at about 200° C. for about 1 hour, thereby forming a gate insulating layer having a thickness of about 300 nm ~about 700 nm.

A thiophene polymer was dissolved in chloroform such that the concentration thereof was about 1 wt % to form a solution. Then, the solution was applied on the gate insulating layer to a thickness of about 50 nm ~about 100 nm using a spin coating method at a spin speed of about 1000 rpm for about 30 seconds, and was then dried on a hot plate at about 100° C for about 10 minutes, thereby forming an organic semiconductor layer. In order to deposit a source electrode and a drain electrode using a shadow mask, the substrate, on which even a polymer semiconductor is formed into a film, was provided with a shadow mask having a channel length of about 100 μm and a channel width of about 1 mm, and was then put into a vacuum chamber to form a vacuum of about $1.0 \times 10^{-6}$ Torr. Gold was thermally deposited at a speed of about 5Å/sec and was thus formed to a thickness of about 1,000Å, thereby manufacturing an organic thin film transistor.

Figure 4:
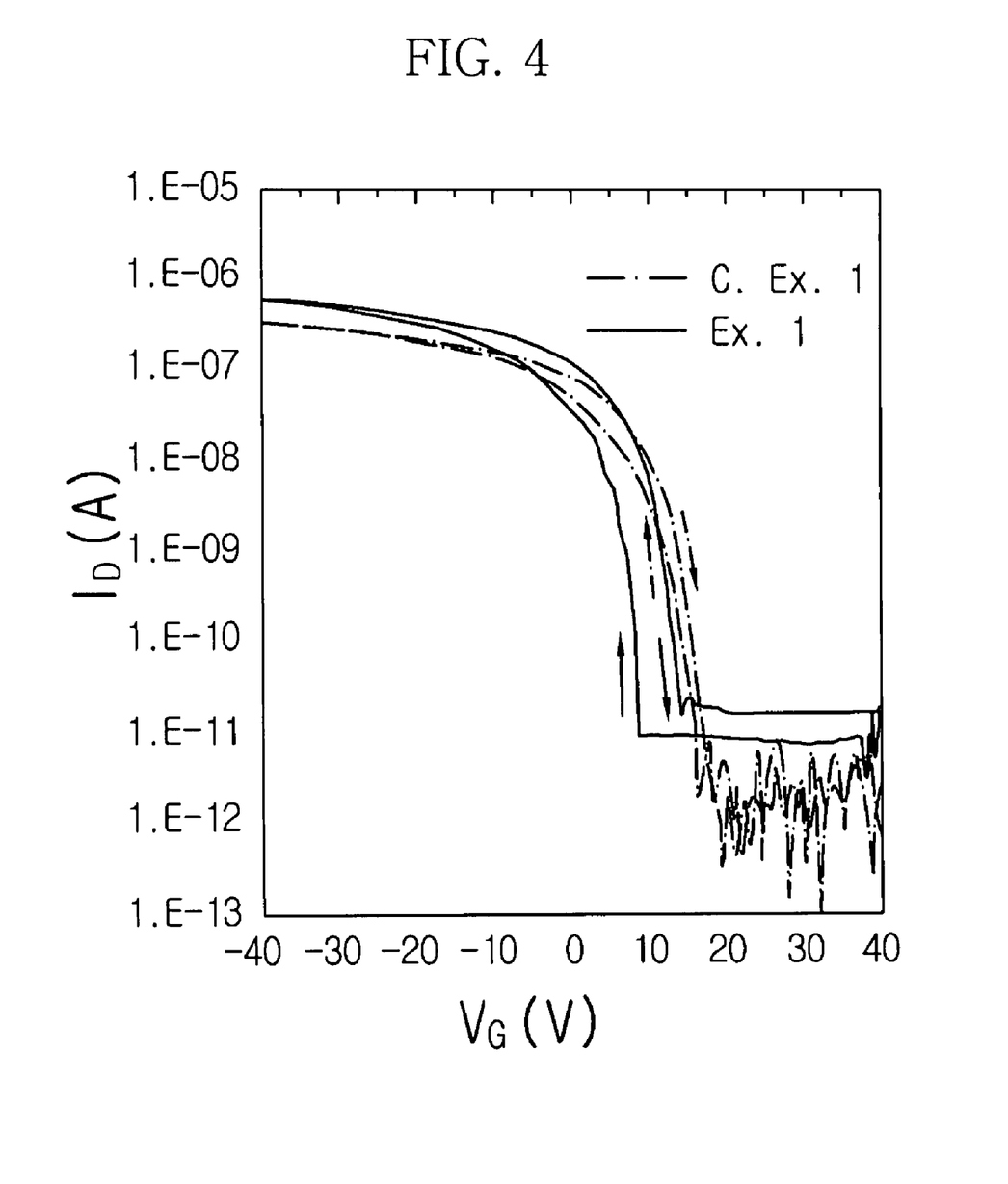
FIG. 4 is a transfer curve of an organic thin film transistor manufactured according to Example 1 and Comparative Example 1 of example embodiments.

The characteristics of the organic thin film transistor thus obtained were measured in an atmosphere having a relative humidity of about 40% using a Semiconductor Characterization System (4200-SCS) from KEITHLEY Ltd., and then a transfer curve thereof was shown in FIG. 4. Further, the charge mobility and current on/off ratio were calculated using the following current equation in a linear region using the transfer characteristic curve, and are given in the following Table 1.

1) Charge Mobility

A graph was obtained from the following current equation, using $(I_{SD})^{1/2}$ and $V_G$ as variables, in a linear region, and then the charge mobility was obtained from a gradient on the graph.

$$I_{SD} = \frac{WC_0}{2L}\mu(V_G - V_T)^2$$

$$\sqrt{I_{SD}} = \sqrt{\frac{\mu C_0 W}{2L}}(V_G - V_T)$$

$$\text{slope} = \sqrt{\frac{\mu C_0 W}{2L}}$$

$$\mu_{FET} = (\text{slope})^2 \frac{2L}{C_0 W}$$

In the equation, ISD is source-drain current, μ or $\mu_{FET}$ is current mobility, $C_0$ is the capacitance of an oxidized film, W is channel width, L is channel length, $V_G$ is gate voltage, and $V_T$ is threshold voltage.

Threshold voltage $V_{TH}$ is obtained from the intersection point of an extension line of a linear portion and a $V_G$ axis in a graph between $(ID)^{1/2}$ and $V_G$. As the absolute value of the threshold voltage approaches 0, the consumption of power may decrease.

2) Current on/off ratio ($I_{on}/I_{off}$)

Current on/off ratio ($I_{on}/I_{off}$) is defined as the ratio of maximum current value in an on state to minimum current value in an off state, and is represented by the following equation.

$$\frac{I_{on}}{I_{off}} = \left(\frac{\mu}{\sigma}\right)\frac{C_0^2}{qN_A t^2}V_D^2$$

In the equation, $I_{on}$ is a maximum current value, $I_{off}$ is off-state leakage current, μ is a charge mobility, σ is the conductivity of a thin film, q is a charge amount, $N_A$ is charge density, t is the thickness of a semiconductor film, $C_0$ is the capacitance of an oxidized film, and $V_D$ is drain voltage. Because the current ratio ($I_{on}/I_{off}$) is increased as the dielectric constant of dielectric film is increased and the thickness thereof is decreased, the type and thickness of dielectric film may be important factors for determining the current ratio. Off-state leakage current ($I_{off}$) is the current flowing in an off state, and was determined from minimum current in the off state.

COMPARATIVE EXAMPLE 1

An organic thin film transistor was manufactured using the same method as in Example 1, and the characteristics thereof were measured using the same method as in Example 1, except that polyhydroxymaleimide-polyhydroxystyrene was used as a material for a gate insulating layer. The results are shown in Table 1 and FIG. 4.

TABLE 1

| Classsification | Contact angle (distilled water) | Charge mobility (cm$_2$/V$_s$) | Current on/off ratio | Threshold voltage $V_{TH}$ at $V_{DS}$ = (−10 V) |
|---|---|---|---|---|
| Comparative Example 1 | 65 | 0.018 | $1.3 \times 10^5$ | +7 V |
| Example 1 | 88 | 0.038 | $2.1 \times 10^5$ | +2 v |

As found through the results in Table 1 and FIG. 4, when the copolymer of example embodiments, having hydrophobic chains and photoreactive chains, was used, it was found that, because the surface energy is effectively decreased, the characteristics of the organic thin film transistor may be improved, and devices in which almost no hysteresis is generated at the time of driving the transistor may be obtained.

Because the copolymer according to example embodiments is a polymer insulator prepared by copolymerizing a group for imparting hydrophobicity and a group having photocrosslinking characteristics, the surface energy of the organic insulating layer formed using the copolymer may be decreased, thereby improving the alignment of a semiconductor material in an organic semiconductor layer formed on the organic insulating layer. Accordingly, the organic thin film transistor manufactured using the copolymer of example embodiments may have improved charge mobility and an improved current on/off ratio, and the photocrosslinking properties may be improved, so that hysteresis may be decreased when the transistor is driven, thereby realizing uniform and stable characteristics.

Further, when the copolymer according to example embodiments is used, the surface energy of an insulating layer may be decreased without performing additional surface treatment, and the insulating layer may be formed through a simpler process, e.g., spin coating, thereby improving overall processability.

As described above, although example embodiments have been disclosed for illustrative purposes, those skilled in the art will appreciate that various modifications, additions and substitutions are possible, without departing from the scope and spirit of example embodiments as disclosed in the accompanying claims.

What is claimed is:

1. A copolymer comprising a repeat unit (A) and a repeat unit (B), represented by the following formula (1):

Formula (1)

(A)

(B)

wherein,

R is a substituted or unsubstituted alky group of about 1 to about 12 carbon atoms, and the substituted alkyl group includes F or Cl, R' is represented by the following formula (2), the sum of m and n is about 1, m is a real number from about 0.1 to about 0.9, and n is a real number from about 0.1 to about 0.9, the sum of x and y is about 1, x is a real number from about 0.1 to about 0.9, and y is a real number from about 0.1 to about 0.9, and a and b are amounts (mol %) of repeat units (A) and (B) in the copolymer, respectively, a is about 10 mol % to about 90 mol %, and b is about 90 mol % to about 10 mol %:

Formula (2)

wherein, $R_1$ is one or more selected from the group consisting of functional groups represented by the following formula (3),

$R_2$ is one or more photoreactive functional groups selected from the group consisting of the following formula (4), and k is an integer from about 0 to about 3,

Formula (3)

wherein m is an integer from about 1 to about 12

Formula (4)

2. The copolymer according to claim 1, wherein the copolymer further comprises a repeat unit (C), represented by the following formula (5), such that an amount of the repeat unit (C) is about 0 mol % ~about 20 mol %, based on the sum of the amount of the repeat unit (A) and the amount of the repeat unit (B):

Formula (5)

(C)

wherein, the sum of I and j is about 1, i is a real number from about 0.1 to about 0.9, and j is a real number from about 0.1 to about 0.9.

3. The copolymer according to claim 1, wherein the repeat unit (A) is represented by the following formula 6 or 7:

Formula (6)

Formula (7)

4. The copolymer according to claim 1, wherein the repeat unit (B) is represented by the following formula 8 or 9:

Formula 8

Formula 9

5. The copolymer according to claim 1, wherein if $R_1$ is plural in number, each $R_1$ is the same.

6. The copolymer according to claim 1, wherein if $R_1$ is plural in number, the $R_1$s are different from each other.

7. An organic insulating layer composition comprising the copolymer according to claim 1.

8. The organic insulating layer composition according to claim 7, wherein the composition further comprises one or more cross-linking agents selected from the group consisting of dipentaerythritol pentaacrylate, dipentaerythritol hexaacrylate, polyethyleneglycol diacrylate, and polyethyleneglycol dimethacrylate.

9. The organic insulating layer composition according to claim 7, wherein the composition includes about 5 wt % ~about 15 wt % of a copolymer, about 10 wt % ~about 40 wt % of a cross-linking agent based on the total amount of the copolymer, and a residual solvent.

10. The organic insulating layer composition according to claim 9, wherein the residual solvent is selected from the group consisting of an aliphatic hydrocarbon solvent, an aromatic hydrocarbon solvent, a ketone-based solvent, an ether-based solvent, an acetate-based solvent, an alcohol-based solvent, an amide-based solvent, a silicon-based solvent, and a mixture thereof.

11. An organic insulating layer including the organic insulating layer composition according to claim 7.

12. The organic insulating layer according to claim 11, wherein the organic insulating layer is formed using a spin coating method, a dip coating method, a roll coating method, a screen coating method, a spray coating method, a spin casting method, a flow coating method, a screen printing method, an ink-jet method, or a drop casting method.

13. An organic thin film transistor, comprising:
a substrate;
a gate electrode;
a gate insulating layer;
an organic semiconductor layer;
a source electrode; and
a drain electrode,
wherein the gate insulating layer is the organic insulating layer according to claim 11.

14. The organic thin film transistor according to claim 13, wherein the organic semiconductor layer is formed using a material selected from the group consisting of pentacene, copper phthalocyanine, polythiophene, polyaniline, polyacetylene, polypyrrole, polyphenylene vinylene and derivatives thereof.

15. The organic thin film transistor according to claim 13, wherein the gate electrode, source electrode, and drain electrode are formed using a material selected from the group consisting of doped silicon (Si) or gold (Au), silver (Ag), aluminum (Al), copper (Cu), nickel (Ni), chromium (Cr), molybdenum (Mo), tungsten (W), and indium tin oxides (ITO).

16. The organic thin film transistor according to claim 13, wherein the substrate is selected from the group consisting of a glass substrate, a silicon wafer substrate, a polyethyleneterephthalate (PET) substrate, a polycarbonate (PC) substrate, a polyethersulfone (PES) substrate and a polyethylene naphthalate (PEN) substrate.

17. The organic thin film transistor according to claim 13, wherein the organic thin film transistor has a top contact structure, a bottom contact structure or a top gate structure.

18. An electronic device comprising the organic thin film transistor according to claim 13.

19. The electronic device according to claim 18, wherein the electronic device is a liquid crystal display (LCD), a photovoltaic device, an organic light emitting diode (OLED), a sensor, memory, or an integrated circuit.

20. A method of fabricating an organic insulating layer comprising:
applying an organic insulating layer composition on a substrate including the copolymer including a repeat unit (A) and a repeat unit (B), represented by the following formula (1):

Formula (1)

wherein,
R is a substituted or unsubstituted alkyl group of about 1 to about 12 carbon atoms, and the substituted alkyl group includes F or Cl,
R' is represented by the following formula (2),
the sum of m and n is about 1, m is a real number from about 0.1 to about 0.9, and n is a real number from about 0.1 to about 0.9,
the sum of x and y is about 1, x is a real number from about 0.1 to about 0.9, and y is a real number from about 0.1 to about 0.9, and
a and b are amounts (mol %) of repeat units (A) and (B), respectively, a is about 10 mol % to about 90 mol %, and b is about 90 mol % to about 10 mol %, $$-(R_1)_k-(R_2)$$

Formula (2)

wherein,
$R_1$ is one or more selected from the group consisting of functional groups represented by the following formula (3),
$R_2$ is one or more photoreactive functional groups selected from the group consisting of the following formula (4), and
k is an integer from about 0 to about 3, $$-(CH_2)_m-O-$$

Formula (3)

wherein m is an integer from about 1 to about 12,

Formula (4)

and then curing the organic insulating layer composition.

21. The method according to claim 20, wherein the organic insulating layer is formed using a spin coating method, a dip coating method, a roll coating method, a screen coating method, a spray coating method, a spin casting method, a flow coating method, a screen printing method, an ink-jet method, or a drop casting method.

22. A method of fabricating an organic thin film transistor, comprising:
    forming a gate electrode, a gate insulating layer, an organic semiconductor layer, a source electrode, and a drain electrode on a substrate,
    wherein the gate insulating layer is the organic insulating layer prepared according to claim 20.

23. The method according to claim 22, wherein the organic semiconductor layer is formed using a material selected from the group consisting of pentacene, copper phthalocyanine, polythiophene, polyaniline, polyacetylene, polypyrrole, polyphenylene vinylene and derivatives thereof.

24. The method according to claim 22, wherein the gate electrode, source electrode, and drain electrode are formed using a material selected from the group consisting of doped silicon (Si) or gold (Au), silver (Ag), aluminum (Al), copper (Cu), nickel (Ni), chromium (Cr), molybdenum (Mo), tungsten (W), and indium tin oxides (ITO).

25. The method according to claim 22, wherein the substrate is selected from the group consisting of a glass substrate, a silicon wafer substrate, a polyethyleneterephthalate (PET) substrate, a polycarbonate (PC) substrate, a polyethersulfone (PES) substrate and a polyethylene naphthalate (PEN) substrate.

26. The method according to claim 22, wherein the organic thin film transistor has a top contact structure, a bottom contact structure or a top gate structure.

27. A method of fabricating an electronic device comprising fabricating the organic thin film transistor according to claim 22.

28. The method according to claim 27, wherein the electronic device is a liquid crystal display (LCD), a photovoltaic device, an organic light emitting diode (OLED), a sensor, memory, or an integrated circuit.

* * * * *